US009865718B1

(12) United States Patent
Xiong et al.

(10) Patent No.: US 9,865,718 B1
(45) Date of Patent: Jan. 9, 2018

(54) POWER MOSFET WITH METAL FILLED DEEP SINKER CONTACT FOR CSP

(71) Applicant: Texas Instruments Incorporated, Dallas, TX (US)

(72) Inventors: Yufei Xiong, Chengdu (CN); Yunlong Liu, Chengdu (CN); Hong Yang, Richardson, TX (US); Ho Lin, Chengdu (CN); Tian Ping Lv, Chengdu (CN); Sheng Zou, Chengdu (CN); Qiu Ling Jia, Chengdu (CN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/342,896

(22) Filed: Nov. 3, 2016

Related U.S. Application Data

(63) Continuation of application No. PCT/CN2016/087968, filed on Jun. 30, 2016.

(51) Int. Cl.

| | |
|---|---|
| ***H01L 29/66*** | (2006.01) |
| ***H01L 29/739*** | (2006.01) |
| ***H01L 29/06*** | (2006.01) |
| ***H01L 29/78*** | (2006.01) |
| ***H01L 21/283*** | (2006.01) |
| ***H01L 21/3213*** | (2006.01) |

(52) U.S. Cl.
CPC ........ *H01L 29/7397* (2013.01); *H01L 21/283* (2013.01); *H01L 21/3213* (2013.01); *H01L 29/0653* (2013.01); *H01L 29/7827* (2013.01)

(58) Field of Classification Search
CPC ............. H01L 29/7397; H01L 21/3213; H01L 29/0653; H01L 21/283; H01L 29/7827
USPC ........................................................ 257/139
See application file for complete search history.

(56) References Cited

U.S. PATENT DOCUMENTS

| | | | | |
|---|---|---|---|---|
| 7,253,474 | B2 * | 8/2007 | Denison | H01L 29/0684 257/339 |
| 8,304,825 | B2 * | 11/2012 | Garnett | H01L 29/41766 257/302 |
| 8,766,164 | B2 * | 7/2014 | Sanfilippo | H01L 31/1075 250/214.1 |
| 2007/0020879 | A1 * | 1/2007 | Baek | H01L 21/76229 438/424 |
| 2007/0205430 | A1 * | 9/2007 | Collins | H01L 29/7371 257/117 |

* cited by examiner

*Primary Examiner* — Vu A Vu
(74) *Attorney, Agent, or Firm* — Kenneth Liu; Charles A. Brill; Frank D. Cimino

(57) ABSTRACT

A method of forming an IC including a power semiconductor device includes providing a substrate having an epi layer thereon with at least one transistor formed therein covered by a pre-metal dielectric (PMD) layer. Contact openings are etched from through the PMD into the epi layer to form a sinker trench extending to a first node of the device. A metal fill material is deposited to cover a sidewall and bottom of the sinker trench but not completely fill the sinker trench. A dielectric filler layer is deposited over the metal fill material to fill the sinker trench. An overburden region of the dielectric filler layer is removed stopping on a surface of the metal fill material in the overburden region to form a sinker contact. A patterned interconnect metal is formed providing a connection between the interconnect metal and metal fill material on the sidewall of the sinker trench.

20 Claims, 10 Drawing Sheets

POWER MOSFET WITH METAL FILLED DEEP SINKER CONTACT FOR CSP

CROSS REFERENCE TO RELATED APPLICATIONS

This is a continuation of copending International Application No. PCT/CN2016/087968 entitled "POWER MOSFET WITH METAL FILLED DEEP SINKER CONTACT FOR CSP", with an international filing date of Jun. 30, 2016, which designated the United States and is herein incorporated by reference in its entirety.

FIELD

Disclosed embodiments relate to vertical power semiconductor devices.

BACKGROUND

High power transistors frequently occupy a major portion of the chip area in a power integrated circuit (IC). Vertical high power devices occupy less area than horizontal high power devices but need contacts to carry current from the buried drain or buried collector to the surface of the substrate. Typically a sinker contact is formed by implanting dopant at a series of different energies to form a highly doped diffusion column extending from the top surface of the substrate down to the buried drain or buried collector. Even with the sinker contact diffusion during operation when high current flows through the diffusion column a significant voltage drop may occur which can limit the performance of the vertical high power transistor.

Some devices on ICs require low contact resistance for improved performance. Typically to reduce contact resistance the diffusion area is increased and multiple contacts are formed to the diffusion. This increases the area of the IC and may also increase the diffusion capacitance which can degrade IC performance.

SUMMARY

This Summary is provided to introduce a brief selection of disclosed concepts in a simplified form that are further described below in the Detailed Description including the drawings provided. This Summary is not intended to limit the claimed subject matter's scope.

In a power field effect transistors (FET) chip scale package (CSP) device, it is recognized that a deep low resistance sinker contact is generally needed extending from the top surface of the device down to the buried drain (for metal oxide semiconductor field effect transistors (MOSFETs)) or buried collector (for bipolar devices) to provide a low resistance connection to device's top surface. This enables all device terminals to be on the die's top surface in form of solder bumps (e.g., bumps on bond pads). For medium voltage power FET devices, it is recognized known sinker contact processes are no longer sufficient to produce the low ON resistance needed by the medium voltage product designs due to high resistance resulting from small critical dimensions (CDs) and the sinker contact being at least several μm deep. A deep sinker contact (>5 μm) can be needed due to the thicker epitaxial layer (epi) used to support medium voltage products (e.g., for a 40V rated device the epi may be about 5.8 μm thick, and for a 60V rated device the epi is thicker, such as being about 7.2 μm thick).

Disclosed embodiments include methods of forming sinker contacts that use metal fill material processing to only partially fill the sinker trench followed by an inner dielectric fill layer (e.g. spin on glass (SOG) and/or other dielectric materials) deposition process to compete the filling of the sinker trench. The metal fill material provides a low resistance contact because electrical contact is made along the full sidewall area and the bottom of the sinker contact, while the inner dielectric filler performs the function of essentially completely filling the sinker contact independent of the sinker depth and the sinker area.

Such processing enables significantly wider and deeper sinker contacts which overcomes the known challenges in contact metal (e.g., W) fill-including semiconductor (e.g., Si) sidewall barrier coverage and metal seams (void regions) when using known deep sinker contact processes particularly when the contact size is large and the depth increases significantly. Disclosed methods can also extend the depth of the sinker contact to a much wider range and still provide low resistance for a variety of different product design needs. More generally, disclosed methods can provide deep sinker contacts covering a wide range of depths for different FET or bipolar design requirements.

BRIEF DESCRIPTION OF THE DRAWINGS

Reference will now be made to the accompanying drawings, which are not necessarily drawn to scale, wherein.

DETAILED DESCRIPTION

Figure 1:
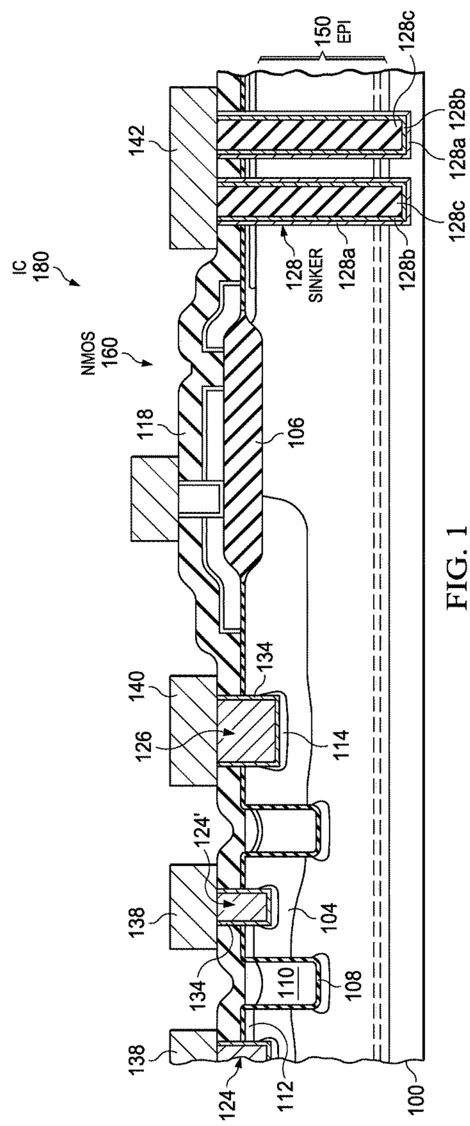
FIG. 1 is a cross sectional depiction of an integrated circuit (IC) with an example power NMOS transistor including a disclosed sinker contact, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

FIG. 1 is a cross sectional depiction of an IC 180 including an example power semiconductor device comprising a vertical power NMOS transistor 160 having two disclosed low resistance sinker contacts (sinker contacts) 128 shown to its buried drain. Although NMOS and NPN transistors are generally described herein, it is clear to one having ordinary skill in the art to use this information to also form PMOS and PNP transistors, by n-doped regions being substituted by p-doping and vice versa. The power semiconductor device can thus comprise a PMOS or NMOS device in a trench gate or planar gate layout, or a PNP or NPN vertical bipolar device, or more generally any device (whether discrete or on an IC) which needs to connect from a buried device terminal (e.g., a buried terminal in a substrate having an epi layer thereon) onto the top surface of the die as an electrical node. An n-type epitaxial (epi) layer 150 having a typical doping level of $5\times10^{15}$ cm$^{-3}$ to $1\times10^{17}$ cm$^{-3}$ is on a low resistance heavily n+ doped layer having a typical doping level of about $1\times10^{18}$ cm$^{-3}$ to $5\times10^{19}$ cm$^{-3}$, where the n+ doped layer is shown provided by a bulk n+ substrate 100 which may be about 500 μm thick. The substrate 100 and epi layer 150 can both comprise silicon, silicon-germanium, or another semiconductor material.

The sinker contacts 128 extend through the epi layer 150 (e.g., being about 5 μm thick as an example) and into the substrate 100. The sinker contacts 128 are generally lined by a barrier metal liner 128*a*. The barrier metal liner 128*a* comprises a refractory metal layer or refractory metal layer stack, such as 800A of TiN on 600A of Ti in one particular embodiment. The barrier metal liner 128*a* is also present at the bottom of the sinker contacts.

The sinker contacts 128 are further filled with a metal fill material 128*b* such as chemical vapor deposited (CVD) tungsten (W) or electroplated copper (on a copper seed), along with an inner dielectric filler layer 128*c* such as silicon oxide on the metal fill material 128*b*. The typical thickness range for the metal fill material 128*b* is 0.1 μm to 1 μm. The thickness for the dielectric filler layer 128*c* is based on the dimensions of the sinker trench as the dielectric filler layer 128*c* completes the filling of the sinker trench. Besides W and copper, the metal fill material 128*b* may also comprise other metals such as Ta, or a platinum group metal (PGM) such as Pt or Pd, their metal silicides, or metal alloys of such metals including Ti—W. The sinker contacts 128 form an electrical contact along the sidewalls and the bottom of the sinker contact that as shown extend through the epi layer 150 into the substrate 100. The sinker contacts 128 may be round or rectangular in shape.

The 2 horizontal dashed lines shown above the substrate 100 in the epi layer 150 are provided to indicate up diffusion of dopant (e.g., phosphorus or arsenic for an n+ substrate) from the substrate 100 into the epi layer 150. Although the sinker contact 128 is shown reaching the substrate 100, if the sinker contact 128 reaches close (say within 0.5 μm to 1 μm) of the epi layer 150/substrate 100 interface this may be sufficient to provide low resistance as that portion of the epi layer 150 under the sinker contact 128 may be sufficiently heavily doped.

To illustrate some benefits of disclosed sinker contacts 128, a power NMOS transistor 160 is used as an example. As noted above, other transistors such as a power PMOS transistor or discrete vertical power bipolar transistors may also be used. In addition, as noted above, the transistors may be discrete devices or as shown part of an IC. The source of the power NMOS transistor 160 is an n-type diffusion 112. The body of the NMOS transistor 160 is a p-well that provides a body region (body) 104 for the NMOS transistor 160. The drain of the power NMOS transistor 160 is the epi layer 150 plus the substrate 100. Gate dielectric 108 electrically isolates the transistor gate electrode 110 from the n-type diffusion 112, the epi layer 150 of the drain, and the body 104 of the NMOS transistor 160. A dielectric isolation layer 106 is shown such as a LOCOS (local oxidation of silicon) layer or STI (shallow trench isolation) layer that electrically isolates the power NMOS transistor 160 from the sinker contact 128.

The body 104 is connected by a contact plug 126 to interconnect lead 140. The contact plug 126 framed by a barrier metal layer 134 (e.g., TiN or TaN) is connected to the p-type body 104 through a heavily doped p-type diffusion 114. The n-type diffusion 112 is connected by source contact plugs 124 to the interconnect leads 138 which as with interconnect leads 140 and 142 and all other leads can comprise aluminum or copper as examples. The contact holes 124' to the body 104 are etched through a pre-metal dielectric (PMD) layer 118 and are typically filled with a barrier metal layer 134 such as titanium plus titanium nitride (Ti/TiN), and then filled with a metallic material such as CVD-W.

During operation when a sufficient voltage is applied to the gate electrode 110 of power NMOS transistor 160 relative to the body 104, for an enhancement device, a channel forms in the body 104 adjacent to the gate dielectric 108 and high current flows from the n-type diffusion 112 acting as a source through channel of the power NMOS transistor 160 and into the substrate 100 region of the drain. Since I=V/R (current=voltage/resistance), when the contact resistance of conventional sinker contacts is high the current provided by the power NMOS transistor 160 is reduced.

The sinker contacts 128 are shown extending vertically from the first layer of interconnect 142 through the PMD layer 118, through the epi layer 150 into the substrate 100 which as noted above is highly doped. This significantly reduces the contact resistance in series with the power NMOS transistor 160. The lowered resistance results in a significant increase in the high power (high current) performance of the power device here being an NMOS transistor 160.

Figure 2:
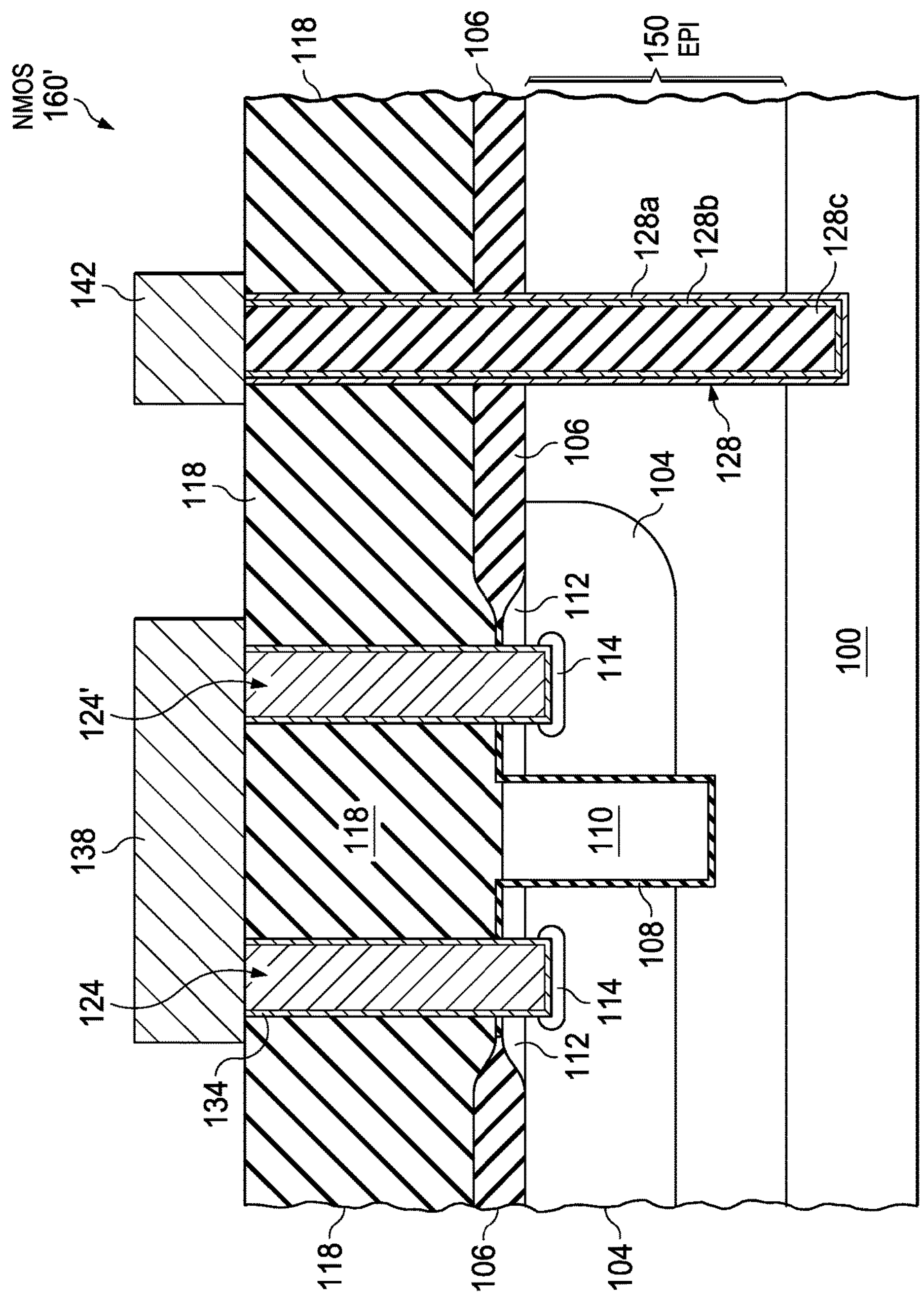
FIG. 2 is a cross sectional depiction of an example power NMOS transistor including a disclosed sinker contact.

A simplified version of the power NMOS transistor 160 shown in FIG. 1 is shown as power NMOS transistor 160' in FIG. 2. The corresponding structures in FIG. 1 and FIG. 2 are labeled with the same numbers. Source/body contacts 124,124' are formed by etching the source contacts through the n-type diffusion 112 as a source 112 and into the p-type body 104. In this version the n-type diffusion 112 as a source is shorted to the body 104 of the vertical NMOS transistor 160 which disables the body diode and enables the area of the MOS transistor to be reduced. Optional p+ diffusions as the p-type diffusion 114 may be formed under the source/body contacts 124, 124'. Power NMOS transistor 160' is unidirectional, where the sinker contact 128 is its drain terminal.

Figure 3:
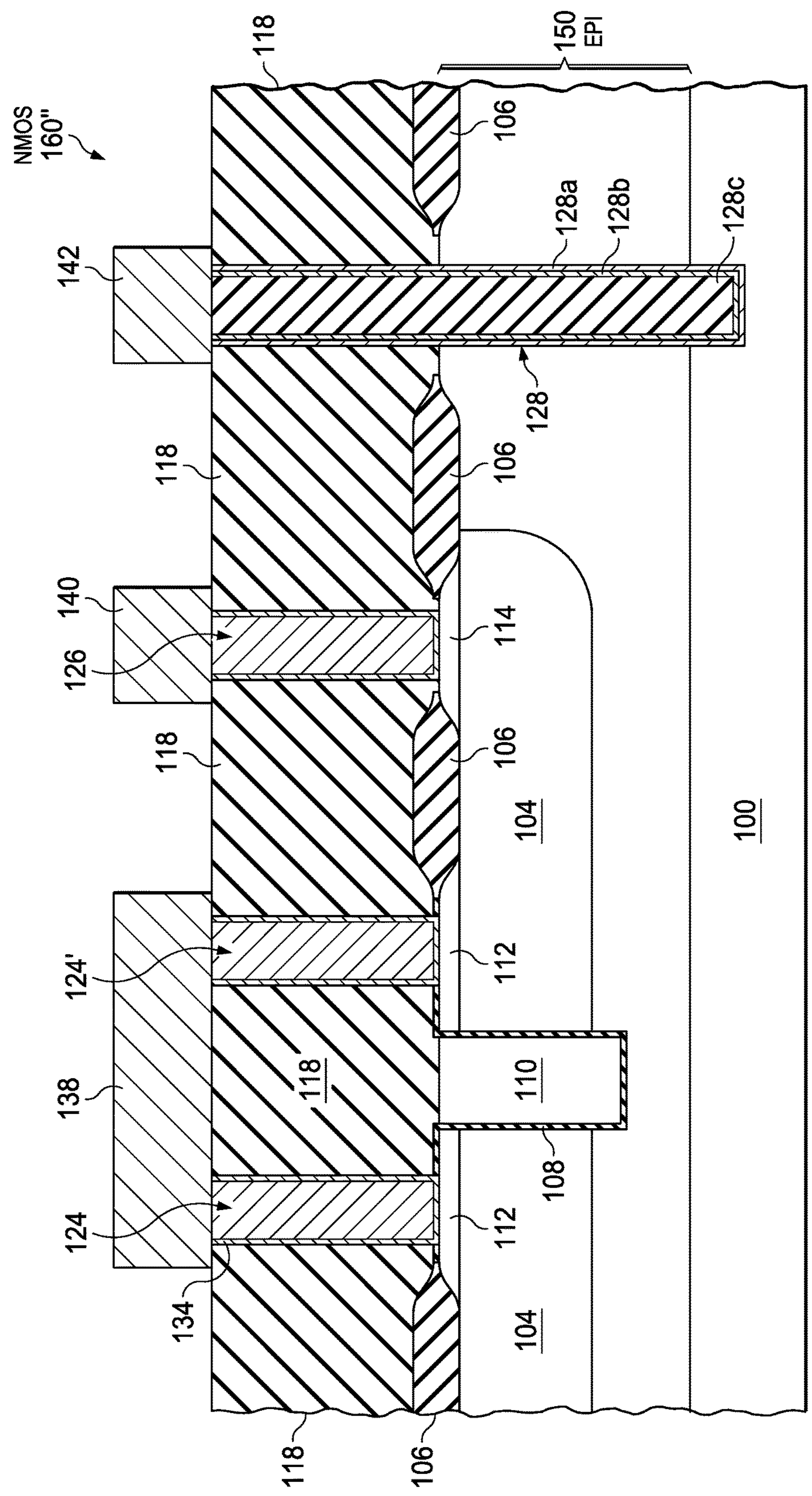
FIG. 3 is a cross sectional depiction of an example power NMOS transistor including a disclosed sinker contact.

Another simplified version of the power NMOS transistor in FIG. 1 is shown in FIG. 3 as power NMOS transistor 160". In this version the p-well contact 126 is separated from the source contact 124. The source contact 124 is only etched to the n-type diffusion 112 as a source and not into the body 104 as in FIG. 2. Power NMOS transistor 160" is bidirectional. The sinker contact 128 may be used as either a low resistance drain contact or a low resistance source contact. When Vcc is connected to the n-type diffusion 112 and Vdd is connected to the sinker contact 128 then the n-type diffusion 112 is the source and the sinker contact is the drain of the vertical NMOS transistor 160". When Vcc is connected to the sinker contact 128 and Vdd is connected to the n-type diffusion 112, then the sinker is connected to the source and the n-type diffusion 112 is the drain of the power NMOS transistor 160".

Figure 4A:
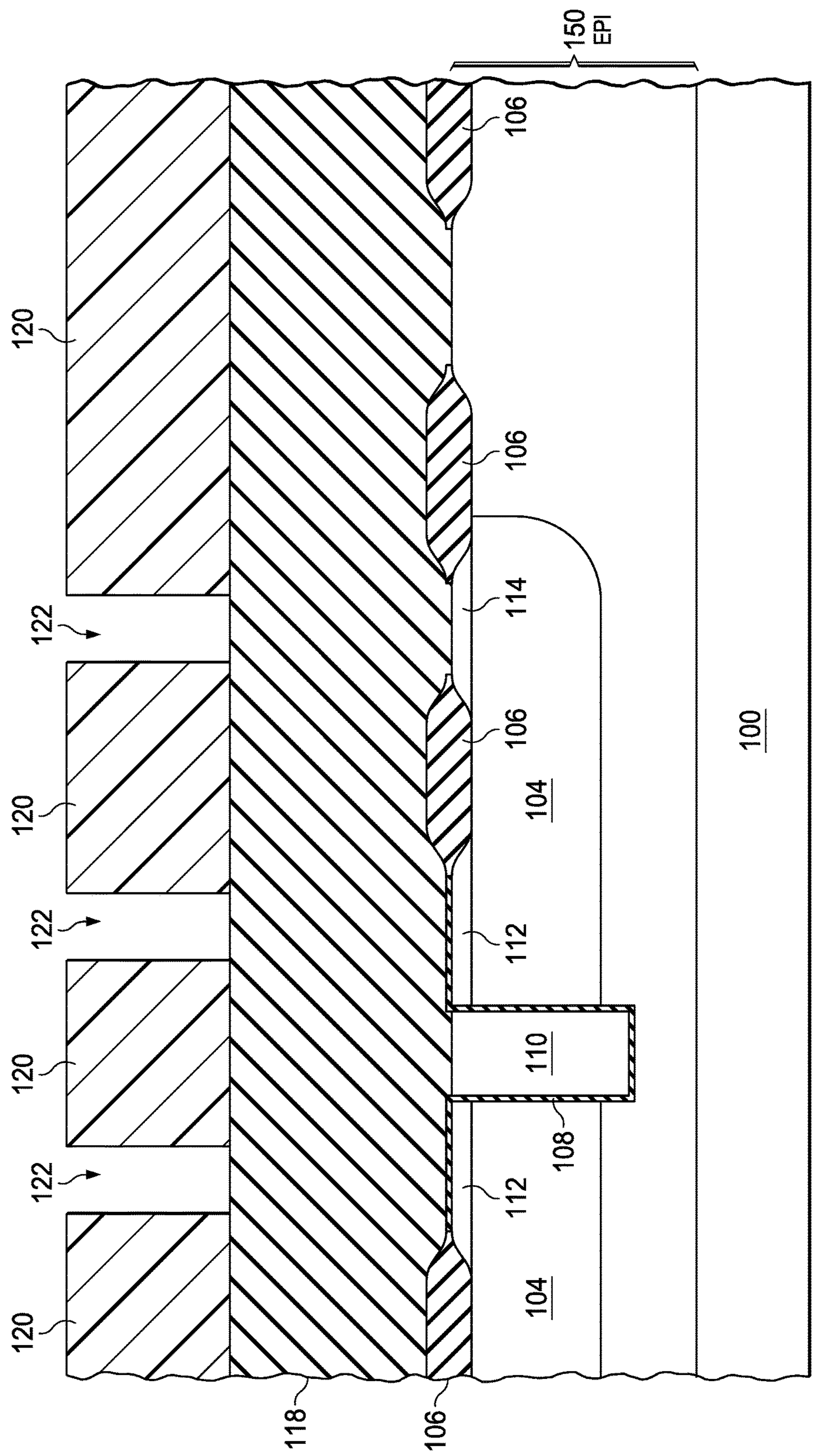
FIG. 4A through FIG. 4H are cross sectional depictions of the power NMOS transistor shown in FIG. 3 depicted in successive stages of fabrication, with FIGS. 4D-4H depicting disclosed deep sinker processing with only a first and second deep sinker shown being formed.

The major steps in the fabrication of the power NMOS transistor 160" with a sinker contact 128 shown in FIG. 3 is described below in FIGS. 4A through 4C, with the deep sinker processing with only a first and second deep sinker shown being formed in FIGS. 4D through 4H. A substrate 100 is provided having an epi layer 150 thereon with at least one transistor formed within the epi layer 150 and being covered by a PMD layer 118. A first contact pattern using a masking layer 120 (e.g., photoresist) is formed on the PMD 118 with pattern openings 122 including for the source and pwell contacts for MOS device(s) and emitter and base contacts for bipolar device(s) are formed. For example, contact openings are then etched through the PMD layer 118 to reach the source of the power NMOS transistor and to the p+ p-well body contact as shown in FIG. 4B.

Figure 4B:
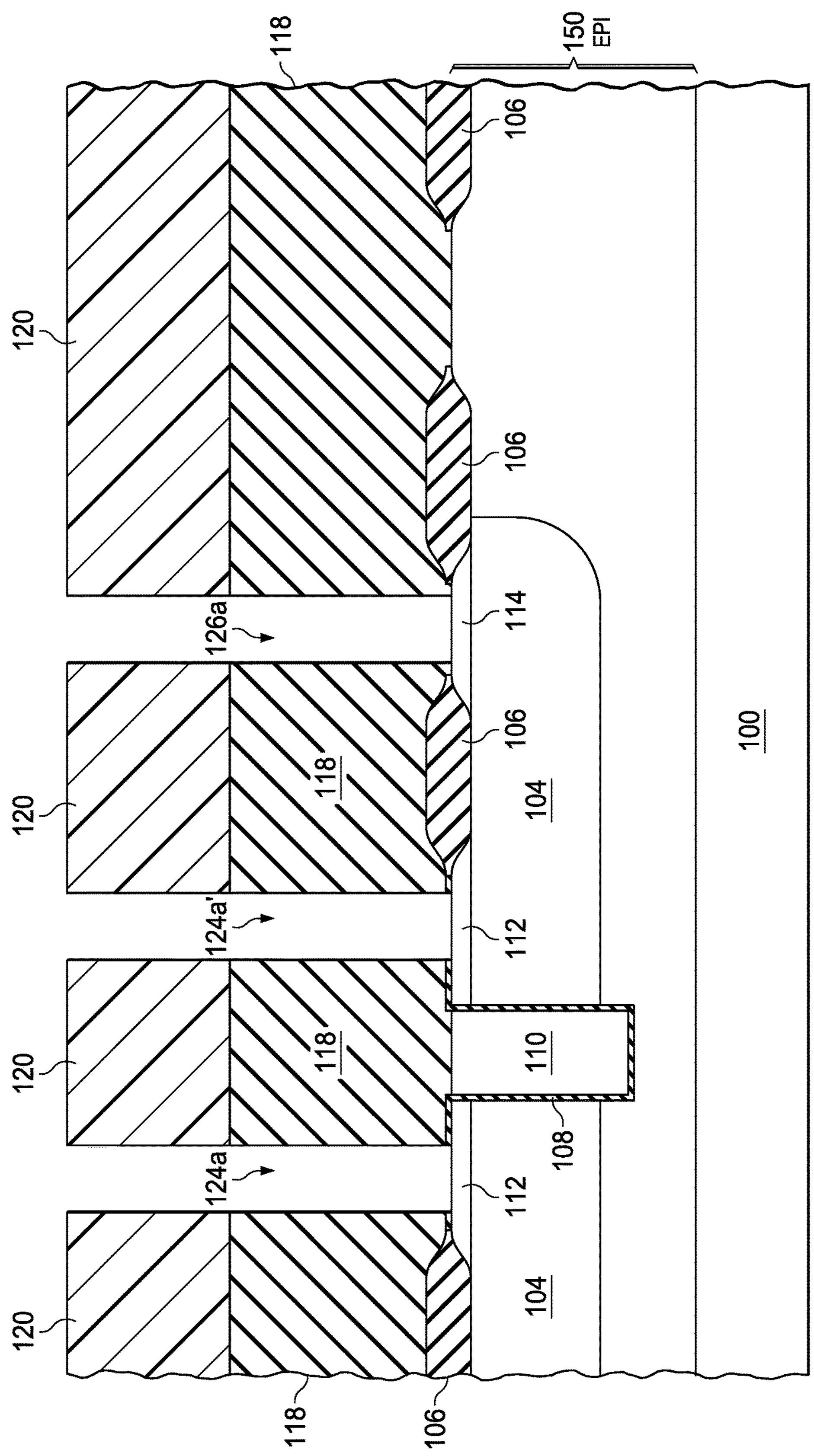
Figure 4C:
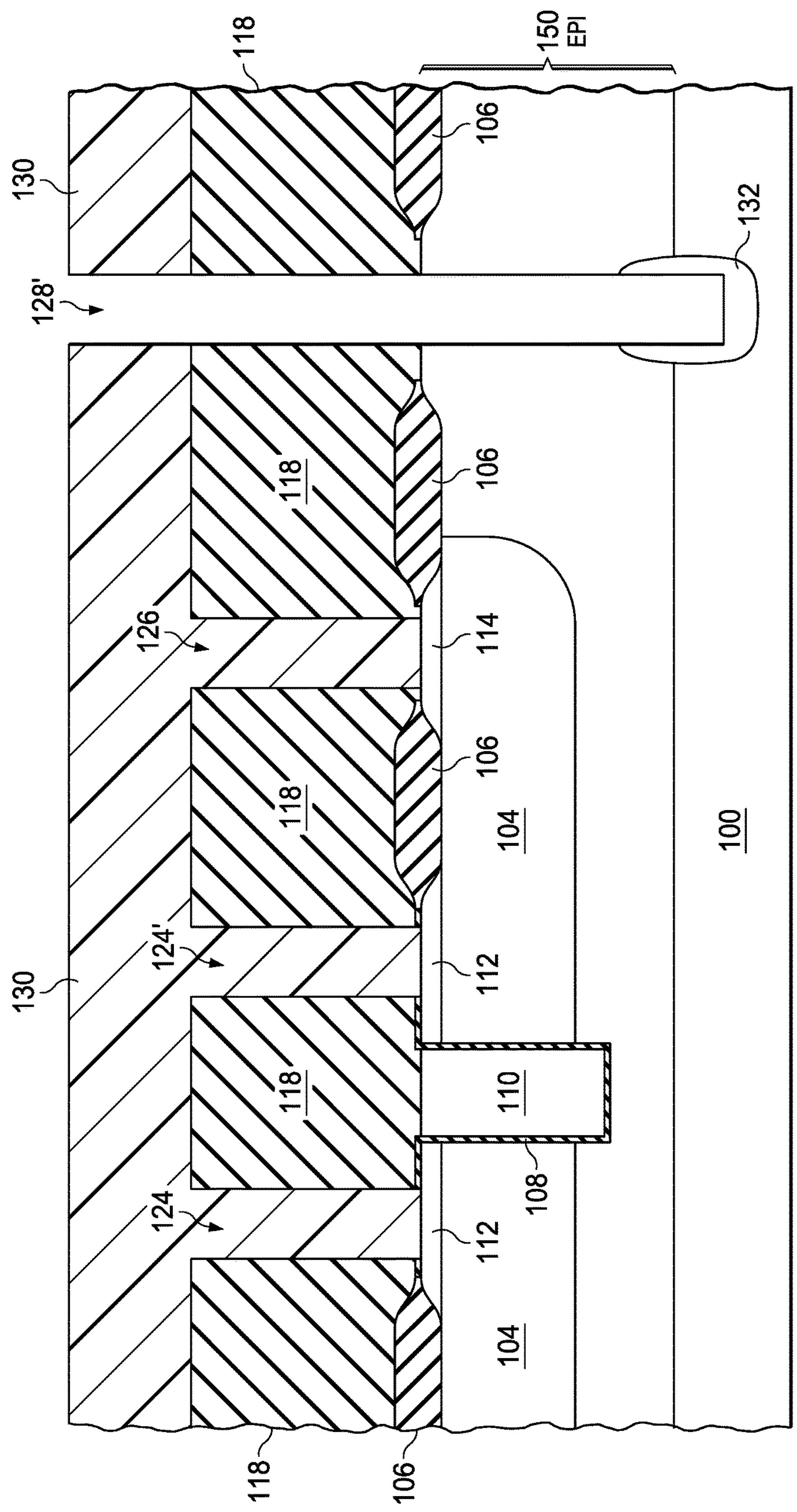

FIG. 4B shows the NMOS transistor after etching to form source contact openings 124*a* for source contact plugs 124 and body contact openings 124*a*' for body contact plugs 124' and 126*a* for the body contact plug 126 shown in FIG. 4C. In FIG. 4C, a separate second sinker contact pattern 130 is also formed on the device with at least one opening formed shown as sinker trench 128' where the sinker contact 128 is to be formed. The sinker trench 128' is etched through the PMD layer 118, through the epi layer 150 and generally into (or almost reaching) the substrate 100. The depth of the sinker trench 128' and thus the sinker contact 128 is generally at least 2 μm, and depends upon the thickness of the epi layer 150 which may be 5 or 7 μm thick, or more. Instead of having a contact area that is only the bottom of the contact, the contact area for the sinker contact 128 includes the bottom of the sinker contact 128 and the full sidewall area of the sinker contact that extends through the full thickness of the epi layer 150 into the substrate 100. As shown in FIG. 4C, an optional implanted region 132 with the same doping type as the substrate (n-type for this example) is shown along the sidewalls and bottom of the sinker contact 128 to add dopant to further reduce the resistance. The second contact pattern 130 is then removed.

Figure 4D:
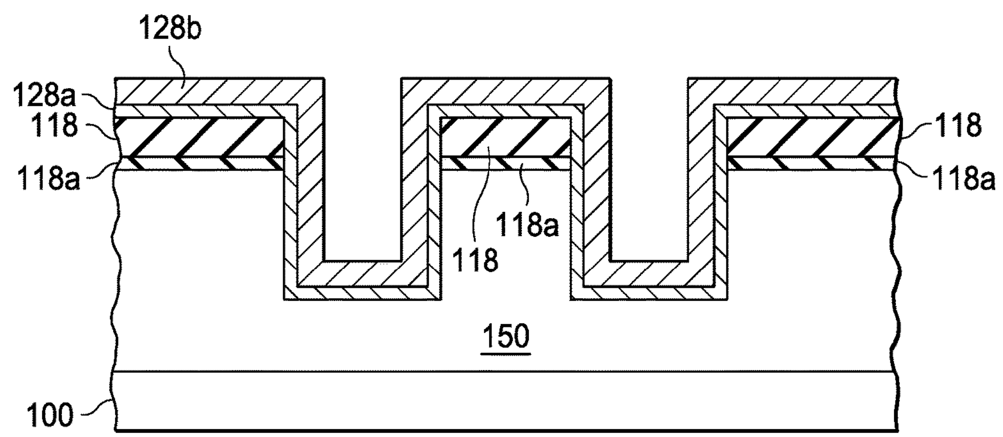

Although not shown, the barrier metal liner 128*a* described above is generally deposited into the contact openings to line the sinker trench 128' before depositing the metal fill material 128*b*. A metal fill material (temp: e.g., CVD W) 128*b* is then deposited, wherein as shown in FIG. 4D the metal fill material 128*b* covers a sidewall and bottom of the sinker trench but does not completely fill the sinker trench. The metal fill material 128*b* generally fills <50% of the contact area above the bottom of the sinker trench, but can be provided in any portion such as for example being in a range from 20% to 50%. A pad oxide 118*a* is shown beneath the PMD 118.

Figure 4E:
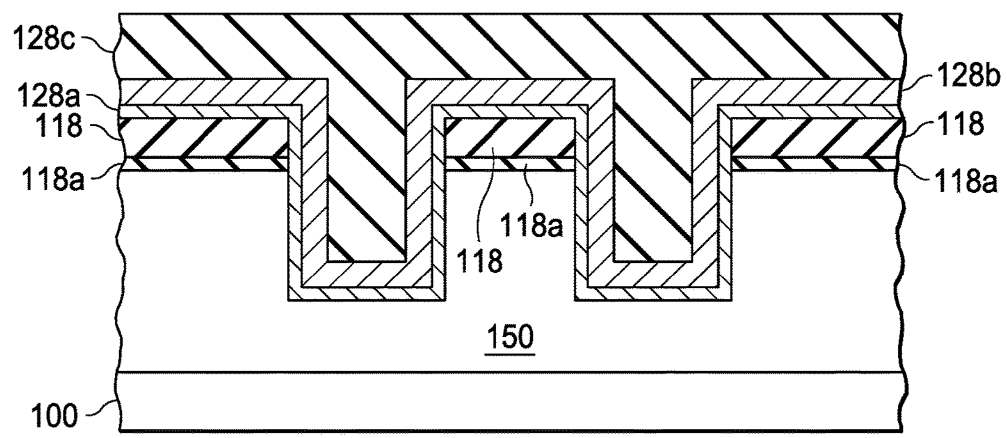

A dielectric filler layer 128*c* is deposited over the metal fill material 128*b*, wherein as shown in FIG. 4E the dielectric filler layer 128*c* completely fills the sinker trench. The dielectric filler layer 128*c* can comprise SOG, tetraethyl orthosilicate (TEOS) or a high-density plasma (HDP) CVD for filling into the remaining contact opening after the deposition of the metal fill material 128*b* (e.g., CVD W). SOG being in liquid form when deposited on the wafer is recognized to provide excellent trench filling properties after curing to provide sintered SOG. Sintered SOG-derived layers have a distinctive microstructure (e.g., as compared to a CVD oxide) as they have micro-porosity due to water and solvent evaporating through interconnected pores during formation which remain in part open at the surface because complete removal of the micro-porosity needs heating to about 1000° C. which is not generally provided with disclosed SOG processing. In one embodiment the dielectric filler layer 128*c* includes both an outer CVD liner dielectric, such as using a TEOS deposition, followed by a thicker inner sintered SOG coating that has a micro-porosity unlike CVD oxide.

Figure 4F:
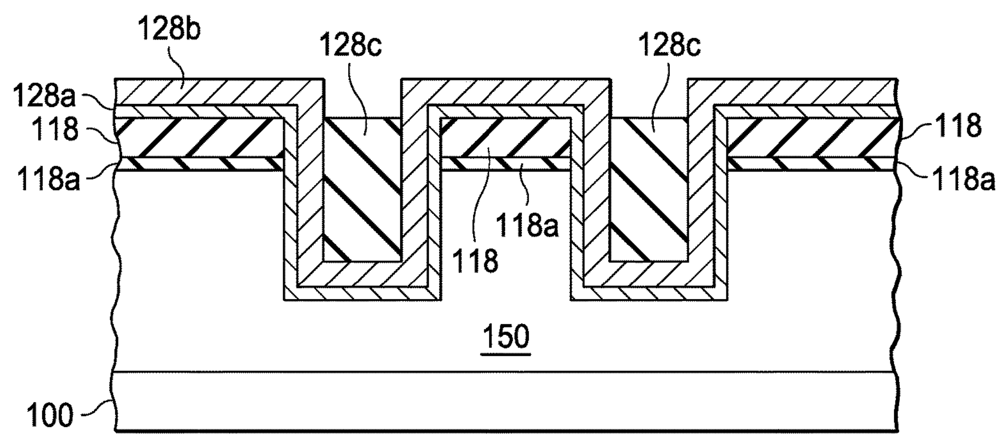
Figure 4G:
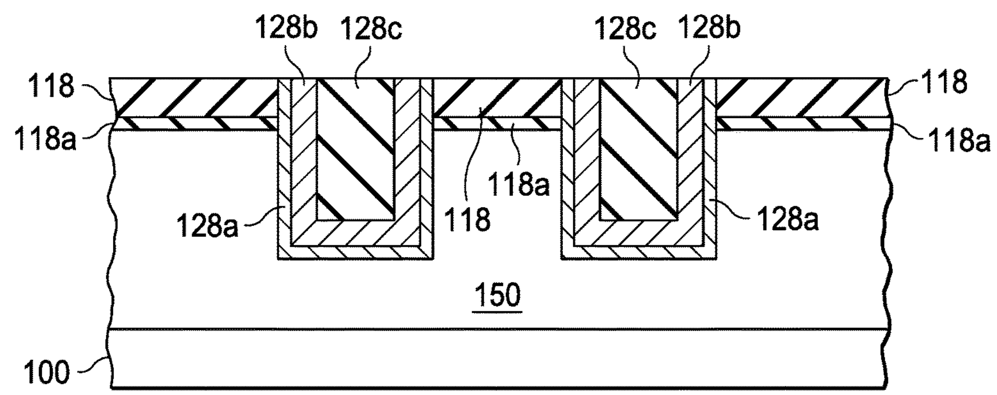
Figure 4H:
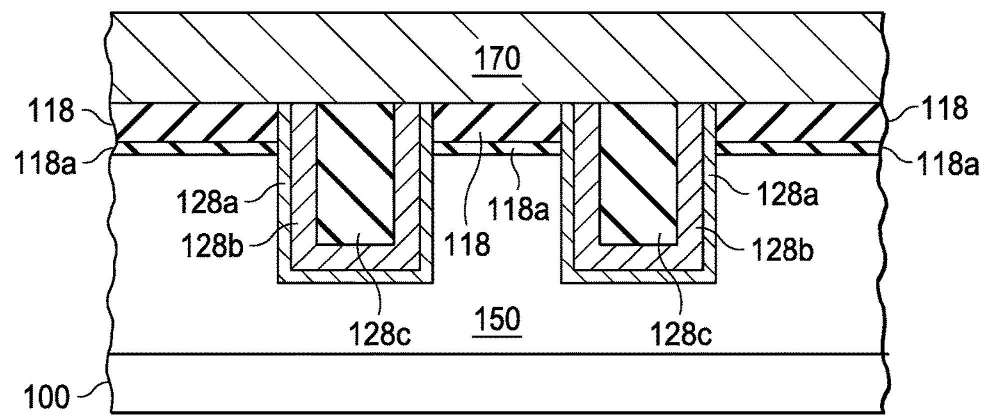

The overburden region of the dielectric filler layer 128*c* is removed, such as by a dry (e.g., plasma) oxide etch back or by chemical mechanical polishing (CMP) stopping on a surface of the metal fill material 128*b* in the overburden region. The resulting structure is shown in FIG. 4F for an oxide etch back process. The metal fill material 128*b* is etched back to remove the overburden region with resulting structure shown in FIG. 4G. A patterned interconnect metal layer 170 is shown formed to provide a connection between the interconnect metal layer 170 and the metal fill material 128*b* on the sidewall of the sinker, with the resulting structure is shown in FIG. 4H.

The use of metal fill material 128*b* that only partially fills the sinker trench followed by dielectric (e.g. SOG) fill enables significantly wider and deeper sinker contacts which overcomes the significant challenges in contact barrier/metal fill (e.g., W) coverage with known deep sinker contact processes particularly when the contact size and depth increase significantly. Disclosed methods can also lower the aspect ratio of the sinker contact and extend the depth of the sinker contact to a much wider range and still provide a low resistance sinker contact for a variety of different product design needs.

Figure 5:
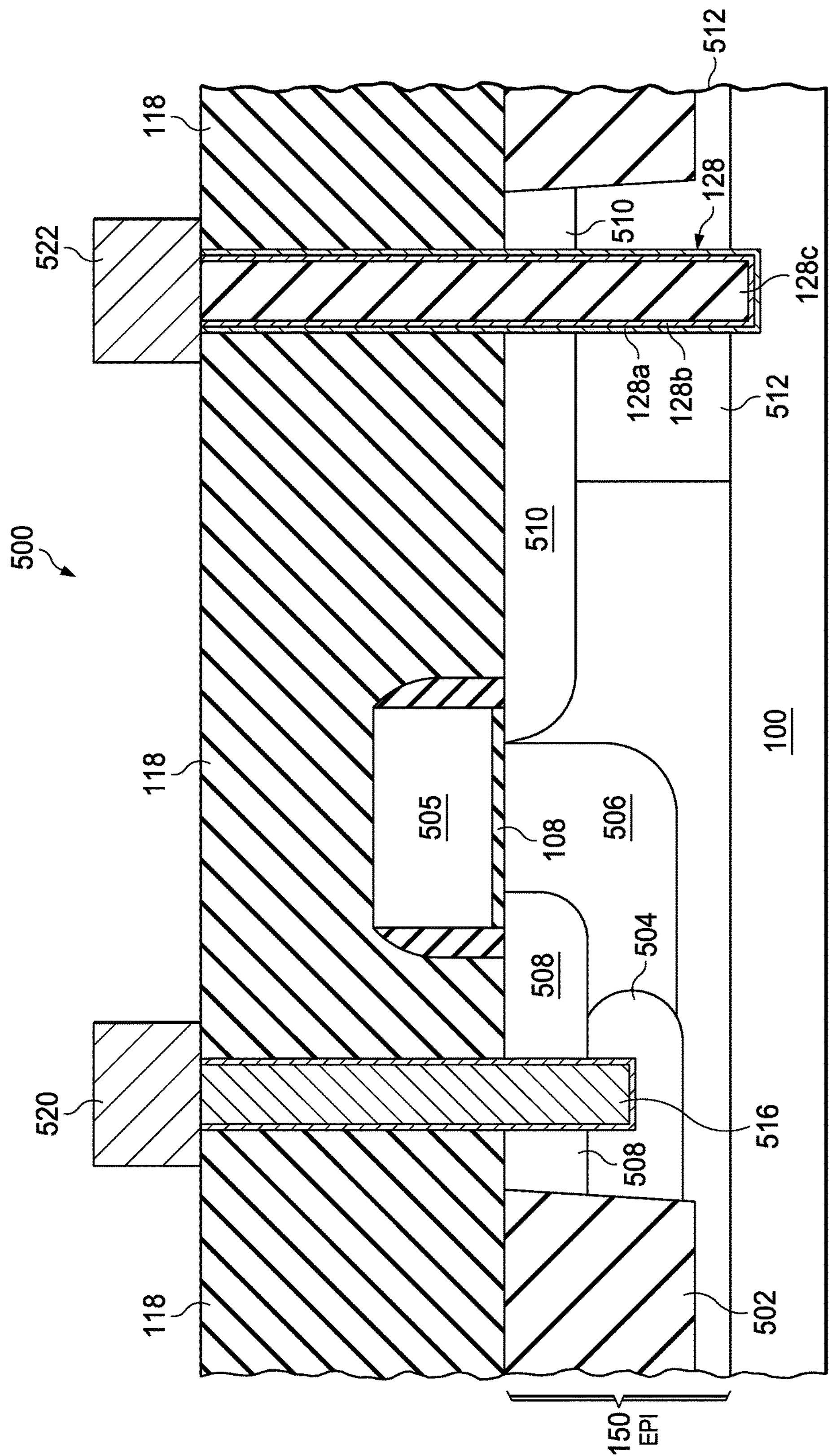
FIG. 5 is a cross sectional depiction of a power NMOS transistor with a disclosed sinker contact to its drain.

A planar high power NMOS transistor 500 with a disclosed sinker contact 128 is shown in FIG. 5 formed on an epi layer 150 that is on a substrate 100. Typically, the backside of the substrate 100 is the drain. In some circuits this presents the problem of providing power to both the topside and bottom side of the semiconductor device/IC as well as sinking the heat generated during operation of the power NMOS transistor 500.

As shown in FIG. 5 a sinker contact 128 is used to electrically connect the heavily doped substrate 100 or other buried n+ layer to the power supply using topside only contacts. The source 508 of the power NMOS transistor 500 is a heavily doped n-type diffusion, while the body 506 (e.g., a pwell) is shorted to the source 508 through a heavily doped p-type diffusion 504 and contact 516. When a sufficient voltage is applied to the gate electrode 505 that is on a gate dielectric layer 108 with respect to the body 506, a channel forms in the body 506 under the gate electrode 505 and current flows through the n-type drain diffusion 510, the n-doped sinker diffusion 512, and the heavily doped n-type layer shown as substrate 100.

The sinker contact 128 connects the substrate 100 and the n-doped sinker diffusion 512 to topside interconnect 522. A topside interconnect 520 is shown coupling to the p-type diffusion 504. The sinker contact 128 enables both Vcc and Vdd to be supplied from the topside of the power NMOS transistor 500. The power NMOS transistor 500 with a sinker contact 128 is illustrated as a unidirectional NMOS transistor with a source/body shorted contact. Although FIG. 5 shows a power MOS transistor 500 with a sinker contact 128, it could equally well have been illustrated with a bidirectional NMOS high power transistor or with a unidirectional or bidirectional PMOS high power transistor.

Figure 6:
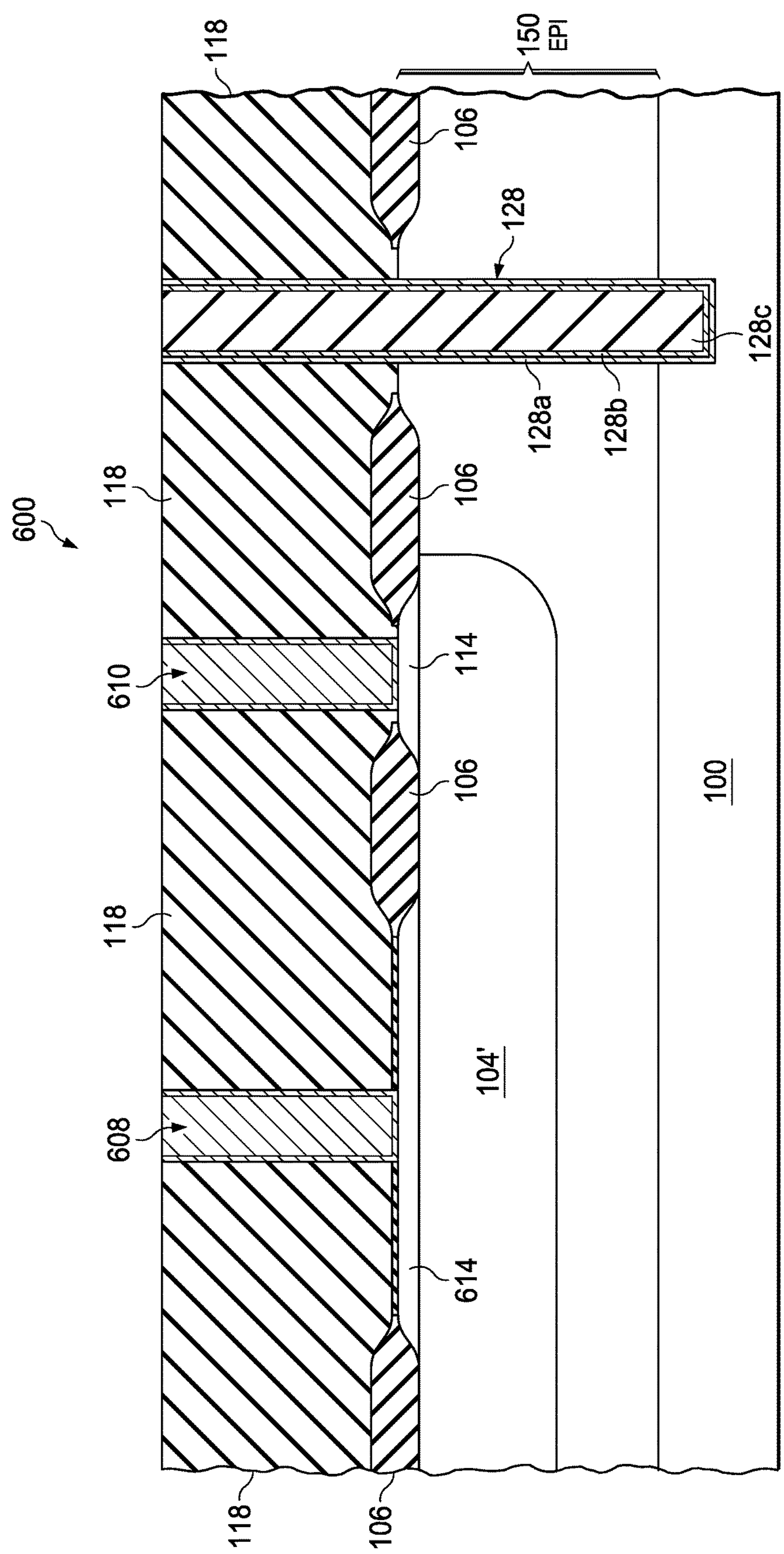
FIG. 6 is a cross sectional depiction of a power NPN bipolar transistor with a disclosed sinker contact to its collector.

A high power vertical NPN bipolar transistor 600 with a disclosed sinker contact 128 is illustrated in FIG. 6. The NPN bipolar transistor 600 includes a heavily doped n-type emitter diffusion 614, a lightly doped ptype base diffusion (p-base) 104', and an n-type collector diffusion comprised of an n-type epi layer 150 on top of a heavily doped n+ layer shown as a substrate 100. The heavily doped collector provides low resistance for handling high current. The sinker contact 128 provides a low resistance path through the relatively lightly doped epi layer 150 significantly improving the performance of the NPN bipolar transistor 600. Contact plug 608 provides an electrical connection through PMD layer 118 to the emitter 614. Contact plug 610 contacts the heavily doped p-type diffusion 114 which provides electrical contact to the p-base 104'.

EXAMPLES

Disclosed embodiments are further illustrated by the following specific Examples, which should not be construed as limiting the scope or content of this Disclosure in any way.

An example power NMOS transistor was formed on an epi layer that was about 5 μm thick on an n+ substrate, both the epi layer and substrate comprising silicon. The sinker contact was formed by sinker contact (CT) photolithography/etching/photoresist removal having a perimeter (CD >3.5 um) to form a sinker trench having a recess depth (depth in the silicon) of about 5.2 μm. The barrier metal liner 128*a* comprised Ti and TiN. The metal fill material 128*b* comprised 7 kA of W that was a W-CVD, which only partially filled the sinker trench. The dielectric filler layer 128*c* deposition comprised 5.5 kA of a liner dielectric using a TEOS deposition process followed by about a 2 μm thick liquid SOG coating followed by curing (at 400° C. for 40 min) of the SOG to provide sintered SOG. An oxide CMP, then etching back of the W metal fill material 128*b*, and finally an aluminum interconnect deposition and patterning followed.

Although disclosed low resistance sinker contacts are illustrated for high power semiconductor devices, such low resistance sinker contacts may be formed on any type of semiconductor device/IC that can benefit from a low resistance sinker in a small area. For example, the usual method of reducing contact resistance is to form multiple contacts or an array of contacts to the diffusion. Sometimes the area of the diffusion is increased to accommodate multiple contacts. One disclosed low resistance sinker contact can generally provide a lower resistance as compared to an array of multiple typical contacts. In addition to lower contact resistance disclosed sinker contacts enable a diffusion with smaller area to be formed which also benefits the circuit performance by reducing the diode capacitance.

Disclosed embodiments can be used to form semiconductor die including discrete or IC die that may be integrated into a variety of assembly flows to form a variety of different devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, Insulated Gate Bipolar Transistor (IGBT), CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:

1. A method of forming an integrated circuit (IC) including a power semiconductor device, comprising:
- providing a substrate having an epitaxial (epi) layer thereon with at least one transistor formed within said epi layer and being covered by a pre-metal dielectric (PMD) layer;
- etching contact openings through said PMD layer and at least a portion of said epi layer, said contact openings including a sinker trench which extends to at least a first node of said power semiconductor device;
- depositing a metal fill material, wherein said metal fill material covers a sidewall and a bottom of said sinker trench but does not completely fill said sinker trench;
- depositing a dielectric filler layer over said metal fill material to fill said sinker trench;
- removing an overburden region of said dielectric filler layer stopping on a surface of said metal fill material in said overburden region to form a sinker contact, wherein a portion of said dielectric filler layer remains in said sinker trench after said removing of said overburden region of said dielectric filler layer; and
- forming a patterned interconnect metal to provide a connection between said interconnect metal and said metal fill material on said sidewall of said sinker trench.

2. The method of claim 1, wherein said depositing said metal fill material comprises chemical vapor depositing (CVD) of tungsten (W).

3. The method of claim 1, wherein said depositing said dielectric filler layer comprises spin on glass (SOG) coating.

4. The method of claim 1, wherein said removing said overburden region of said dielectric filler layer comprises chemical mechanical polishing (CMP).

5. The method of claim 1, wherein said epi layer is at least 5 μm thick, and said sinker trench reaches an interface between said epi layer and said substrate.

6. The method of claim 1, wherein said power semiconductor device comprises a metal-oxide-semiconductor field effect transistor (MOSFET) device, and wherein said first node comprises a drain.

7. The method of claim 1, wherein said power semiconductor device comprises a bipolar device, and wherein said first node comprises a collector.

8. The method of claim 1, wherein a doping level in said epi layer is at least one order of magnitude less than a doping level in said substrate, and said sinker contact extends into said substrate.

9. The method of claim 1, further comprising forming a barrier metal liner in said sinker trench before said depositing said metal fill material.

10. A power semiconductor device, comprising
- a substrate having an epitaxial (epi) layer thereon;
- a first device terminal, a second device terminal within a well, and a third device terminal comprising one of a buried drain and a buried collector;
- a sinker contact comprising a filled sinker trench extending through a pre-metal dielectric layer and at least a portion of said epi layer to said third device terminal, wherein said sinker contact comprises a metal fill material that covers a sidewall and a bottom of said sinker trench but does not completely fill said sinker trench, and an inner dielectric filler layer disposed inside said metal fill material for filling said sinker trench so that at least a portion of said metal fill material is disposed between said sidewall and said inner dielectric filler layer.

11. The power semiconductor device of claim 10, wherein said metal fill material comprises tungsten (W).

12. The power semiconductor device of claim 10, wherein said dielectric filler layer comprises a sintered spin on glass (SOG) coating that has micro-porosity.

13. The power semiconductor device of claim 10, wherein said epi layer is at least 5 μm thick, and wherein said sinker trench reaches an interface between said epi layer and said substrate.

14. The power semiconductor device of claim 10, wherein said power semiconductor device comprises a metal-oxide-semiconductor field effect transistor (MOSFET) device, and wherein said third device terminal comprises said buried drain.

15. The power semiconductor device of claim 10, wherein said power semiconductor device comprises a bipolar device, and wherein said third device terminal comprises said buried collector.

16. An integrated circuit (IC) including a power semiconductor device, comprising:

a substrate having an epitaxial (epi) layer thereon;

said power semiconductor device including:

a first device terminal, a second device terminal within a well, and a third device terminal comprising one of a buried drain and a buried collector;

a sinker contact comprising a filled sinker trench extending through a pre-metal dielectric layer and at least a portion of said epi layer to said third device terminal, wherein said sinker contact comprises a metal fill material comprising tungsten (W) that covers a sidewall and a bottom of said sinker trench but does not completely fill said sinker trench, and an inner dielectric filler layer inside said metal fill material for filling said sinker trench so that at least a portion of said metal fill material is disposed between said sidewall and said inner dielectric filler layer.

17. The IC of claim 16, wherein a dielectric filler layer comprises a sintered spin on glass (SOG) coating that has micro-porosity.

18. The IC of claim 16, wherein said epi layer is at least 5 μm thick, and said sinker trench reaches an interface between said epi layer and substrate.

19. The IC of claim 16, wherein said power semiconductor device comprises a metal-oxide-semiconductor field effect transistor (MOSFET) device, and wherein said third device terminal comprises said buried drain.

20. The IC of claim 16, wherein said power semiconductor device comprises a bipolar device, and wherein said third device terminal comprises a collector.

* * * * *